United States Patent [19]

Yamazaki

[11] Patent Number: 4,704,300

[45] Date of Patent: Nov. 3, 1987

[54] METHOD FOR PRODUCING SILICON NITRIDE LAYER

[75] Inventor: Shunpei Yamazaki, Tokyo, Japan

[73] Assignee: Semiconductor Energy Laboratory Co., Ltd., Kanagawa, Japan

[21] Appl. No.: 710,111

[22] Filed: Mar. 11, 1985

[30] Foreign Application Priority Data

Mar. 12, 1984 [JP] Japan .................................. 59-46839
Oct. 19, 1984 [JP] Japan ................................ 59-220108

[51] Int. Cl.$^4$ ............................................. B05D 3/06
[52] U.S. Cl. ...................................................... 427/38
[58] Field of Search ................................ 427/54.1, 38

[56] References Cited

U.S. PATENT DOCUMENTS 4,181,751  1/1980  Hall et al. ........................... 427/53.1
4,485,121 11/1984  Matsumura ......................... 427/87 X
4,495,218  1/1985  Azuma et al. ...................... 427/53.1

Primary Examiner—Bernard D. Pianalto
Attorney, Agent, or Firm—Gerald J. Ferguson, Jr.; Michael P. Hoffman; Michael J. Foycik

[57] ABSTRACT

A silicon nitride layer is formed on a substrate by reacting (1) a silicon fluoride, (2) nitrogen or nitrogen hydride and (3) a nitrogen fluoride by a plasma chemical vapor deposition (thermal energy and electronic energy are applied) process.

According to the invention, fluorine is added in the silicon nitride layer to produce a Si-F coupling and thus it is made possible to reduce a concentration of hydrogen in the silicon nitride film.

It is also possible to make a concentration of oxygen in the silicon nitride layer less than 1/10 of that of the conventional silicon nitride.

3 Claims, 2 Drawing Figures

METHOD FOR PRODUCING SILICON NITRIDE LAYER

BACKGROUND OF THE INVENTION (i) Field of the Invention

This invention relates to a method for producing a silicon nitride layer on a substrate by a chemical vapor deposition (CVD) process utilizing a plasma chemical reaction, and more particularly to a technology which is applied for producing a coating of an optical fiber, a stabilized film for a semiconductor device and a gate insulation film for IG-FET etc.

(ii) Description of the Prior Art

Conventionally, a silicon nitride layer is produced in such a manner that silane ($SiH_4$) and ammonia ($NH_3$) are reacted by a plasma chemical vapor deposition utilizing a glow discharging to prepare the layer on a substrate of about 200° to 400° C.

Thus formed silicon nitride layer has odd electric charges due to presence of unpaired couplings of silicon atoms or of silicon clusters which are produced by silane in the layer. Because of the presence of the odd charges, layers made by the conventional process have been found insufficient for a final coating of MOS, IC and so on. In particular, in case of the semiconductor device memory, there has been a demand of such a silicon nitride layer as will make the ultraviolet rays having a wave length of 254 nm (applied for writing of EP ROM) pass therethrough without influencing the stabilized layer.

SUMMARY OF THE INVENTION

An object of the invention is to produce a silicon nitride layer on a substrate by reacting (1) a silicon fluoride, (2) nitrogen or nitrogen hydride and (3) a nitrogen fluoride by a plasma CVD (thermal energy and electronic energy) process.

According to the inventive method, fluorine is added in the silicon nitride layer to produce a Si-F coupling and thus it is made possible to reduce a concentration of hydrogen in the silicon nitride film.

In accordance with the present invention, it is possible to make a concentration of oxygen in the silicon nitride layer less than 1/10 of that of the conventional layer.

Further, in accordance with the present invention, it is possible to make a silicon nitride layer without spattering on the surface due to the fact that the plasma CVD is carried out under a low discharging energy.

Moreover, in accordance with the present invention, it is possible to make a silicon nitride film with a surface state density of $3 \times 10^{11}$ cm$^{-2}$ or less.

DESCRIPTION OF THE EMBODIMENTS

Figure 1:
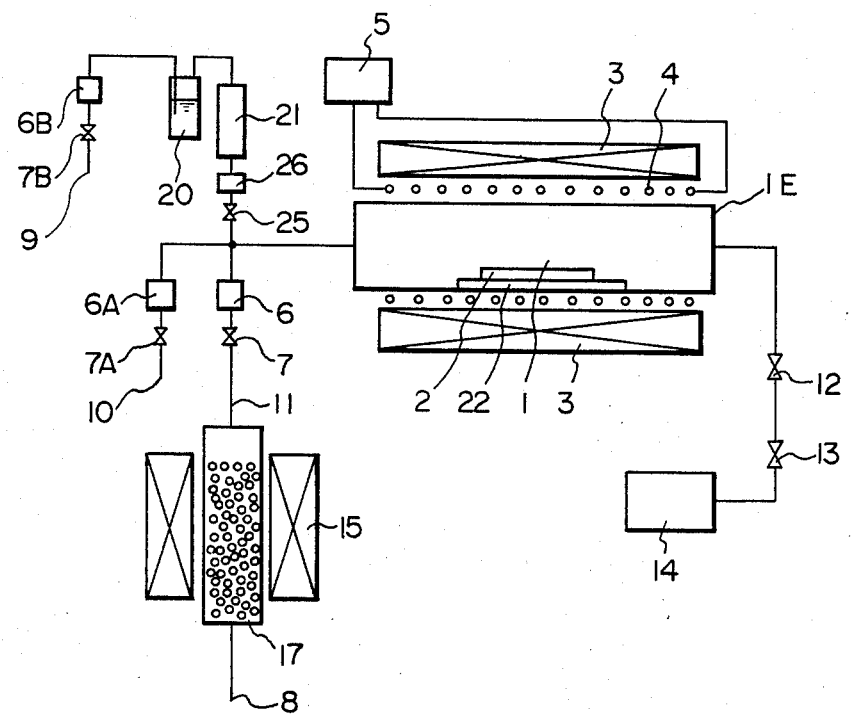
FIG. 1 is a schematic illustration of a plasma CVD apparatus according to the present invention.

FIG. 1 illustrates an example of an apparatus for making a silicon nitride layer on a substrate by a method wherein both a silicon fluoride $SiF_x$ (X=2 to 4) and nitrogen or nitrogen hydride are chemically reacted by a plasma CVD (thermal energy and electronic energy) process.

In FIG. 1, a deposition reactor (vacuum reactor) (1E) is made of quartz. A substrate (2) is arranged in the quartz tube (1E) enclosed by a heater (3) and its heating temperature is in a range of 200° to 400° C. (for example, 300° C). A doping system is composed of flow meters (6), (6A), (6B) and (26) and valves (7), (7A), (7B) and (25), and ammonia or nitrogen is supplied from a point (10). Since hydrazine ($N_2H_4$) (melting point=1.4° C. and boiling point=113.5° C.) is in a liquid state at a room temperature, it is charged in a bubbler (20). As hydrazine, hydrazine anhydride is used and it is dehumidified and purified to an extremely high purity through Molecular Sieves (21). Silicon fluoride is fed in a form of $SiF_4$ from a point (8) into a quartz tube containing metalic silicon (17) (purity is 9N or more) and is heated by a heater (15) up to 1000° to 1250° C. to prepare $SiF_2$. The reaction proceeds according to the following formula:

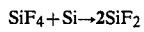

The reactive gas (actually, a mixture gas of $SiF_2$ and $SiF_4$) is fed into the deposition reactor from a point (11), passes through a discharging port, a pressure adjusting valve (12) and a stop valve (13) and then discharged through the exhaust pump (14). There is arranged an electric energy supplying device (5) for carrying out a plasma chemical reaction. There is also arranged a resistance heater (3) enclosing a high frequency energy supplying coil (4).

EXAMPLE 1

This example shows a process for producing a silicon nitride layer on a single silicon substrate by a plasma CVD using $SiF_2$ and ammonia.

Apparatus shown in FIG. 1 was used. The substrate temperature was 300° C. (similar results may be obtained at a temperature ranging from 200° to 700° C.). A reactive gas was made into a plasma state (plasma density: 0.3 mW/cm$^2$) under an application of an electric energy (13.56 MHz) at a pressure of 0.7 torr.

An electrode is made on the silicon nitride layer to make a diode structure and its C-V characteristic was measured. The surface state density was $3 \times 10^{11}$ cm$^{-2}$ or less. When DC electric field was applied, a hysteresis characteristic was not observed until the electric field becomes $1 \times 10^6$ V/cm or more. This means that a volume of oxygen come into the silicon nitride layer on the silicon substrate is reduced as compared with the oxygen amount in the layer produced by the conventional plasma CVD process using ammonia and silane.

Figure 2:
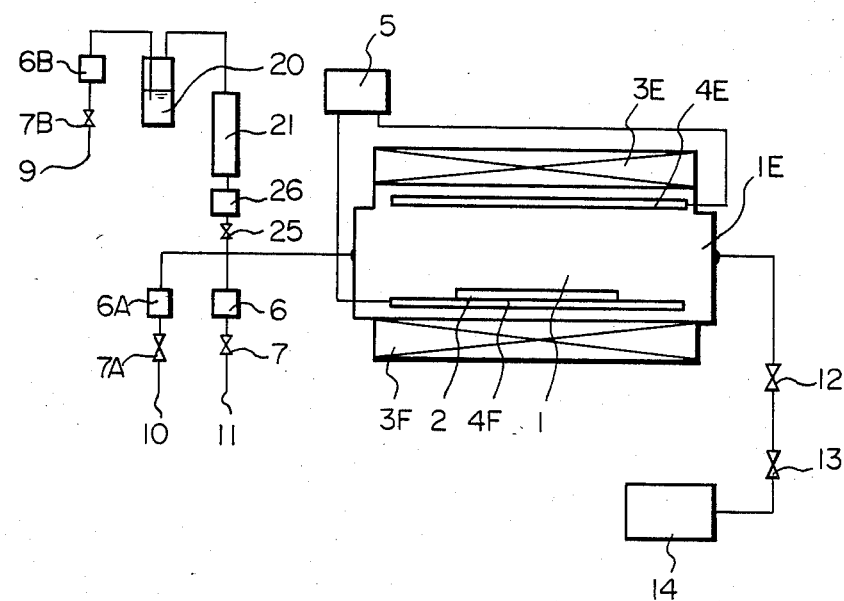
FIG. 2 is a schematic illustration of another plasma CVD apparatus according to the present invention.

FIG. 2 illustrates an example of an apparatus for producing a silicon nitride layer by a method wherein a silicon fluoride $Si_nF_{2n+2(n=2, 3 ...)}$ and nitrogen, nitrogen hydride (e.g. $NH_3$, $N_2H_4$) or nitrogen fluoride (e.g. $NF_3$, $N_2F_4$) are chemically reacted by a plasma CVD process.

In FIG. 2, the deposition reactor (vacuum reactor) (1E) has an inner wall made of quartz. The substrate (2) is mounted on one of the parallel plate-like electrodes and heated by the halogen heaters (3E), (3F) arranged above and below the reaction oven up to a temperature of 200° to 400° C., for example 300° C. The doping system is composed of flow meters (6), (6A), (6B) and (26) and valves (7), (7A), (7B) and (25). Ammonia or nitrogen is fed at a point (10). Since hydrazine ($N_2H_4$)(melting point=1.4° C. and boiling point=113.5° C.) is in a liquid state at a room temperature, it is charged in a bubbler (20). As hydrazine, hydrazine anhydride was used, and it is dehumidified and purified so as to have an extremely high purity through Molecular Sieves (21). Silicon fluoride is fed as $Si_2F_6$ from (11) through a bomb.

The reacton gas is fed into the reaction container (1E), passes through a discharge opening, a pressure adjusting valve (12) and a stop valve (13) and then discharged through an exhaust pump (14).

There is arranged an electric energy supplying device (5) for carrying out a plasma reaction. Further, there is arranged a resistance heater enclosing low frequency energy supplying coils (4E) and (4F).

EXAMPLE 2

A silicon nitride layer was made on a single crystal silicon substrate by a plasma CVD using $Si_2F_6$ and ammonia.

The substrate temperature was set to be between 100° to 500° C., for example 350° C. Reaction gas was made into a plasma state (plasma density: 0.1 mW/cm$^2$) at a pressure of 0.07 torr and by electric energy supplied to a pair of electrodes (4E) and (4F). By use of $Si_2F_6$, the electric energy density required for making plasma can be reduced down to a range of $\frac{1}{2}$ to $\frac{1}{3}$ as compared with the necessary energy density when $SiF_4$ is used. Therefore, the process using $Si_2F_6$ is advantageous because of less spattering (damage) on the substrate. The frequency of the electric energy was in a range of 10 to 200 KHz.

Infrared absorption spectrum (IR) revealed that the layer (thickness 0.5$\mu$) made by the process described above has a high absorption point at about 900 cm$^{-1}$, which means the layer is silicon nitride.

Further, surprisingly, inspection by the secondary ion microscopic spectroscopy (SIMS / Model 3F of Kameca Co., Ltd. was used) revealed that oxygen concentration in the silicon nitride layer according to the invention is quite low and 1 to $5 \times 10^{19}$ cm$^{-3}$, which is less than 1/10 of the oxygen concentration in a silicon nitride made by a conventional plasma CVD process utilizing $SiH_4$ and $NH_3$, considering the conventional silicone nitrides include a considerable amount of oxygen up to 2 to $5 \times 10^{20}$ cm$^{-3}$. The reason may be elucidated as follows. That is, HF is produced as a residual gas after the reaction of $SiF_2$ and $N_2H_4$. HF is reacted with $SiO_2$ which is likely to be present as an impurity, and a stable $SiF_4$ is produced following the formula:

$$SiO_2 + 4HF \rightarrow SiF_4 + H_2O$$

Because the water produced by the reaction does not react with $SiF_4$, purification will be completed simultaneously with the formation of the film. On the other hand, in the conventional reaction between silane and ammonia, may leak into the deposition reactor at a room temperature and react with the residual oxygen, forming and leaving silicon oxide in the layer, which leads to an increased amount of contained in the silicon nitride layer.

An electrode was made on the silicon nitride and C-V characteristic was measured to see a diode structure. The surface state density was less than $3 \times 10^{11}$ cm$^{-2}$. When DC electric field was applied to the finished silicon nitride layer, a hysteresis characteristic was not observed until the electric field was made to become $1 \times 10^6$ V/cm. It was found that the amount of silicon which mixed into the silicon nitride formed on the silicon substrate was reduced and the charge trap center was decreased.

Although the explanation was made mainly on $SiF_2$ and $Si_2F_6$ in the above examples, they should not be construed as limiting the present invention. Silicon fluoric hydrides such as $H_2SiF_2$, $HSiF_3$ and $H_3SiF$ etc. will produce a similar result.

What is claimed is:

1. A method for producing a silicon nitride layer, wherein the layer is produced on a surface of a substrate while the substrate is heated by applying a thermal energy and an electric energy to a reaction gas mixture composed of a silicon fluoric hydride gas represented by $H_nSiF_m$ (m=1, 2, 3; n=0 to 3) and hydrogen nitride gas.

2. A method for producing a silicon nitride layer as set forth in claim 1, wherein the reaction gas mixture contains $SiF_2$, ammonia or hydrazine.

3. A method for producing a silicon nitride layer as set forth in claim 1, wherein the silicon fluoric hydride gas is $Si_2F_6$.

* * * * *